(12) United States Patent
Weidman et al.

(10) Patent No.: US 6,875,687 B1
(45) Date of Patent: Apr. 5, 2005

(54) CAPPING LAYER FOR EXTREME LOW DIELECTRIC CONSTANT FILMS

(75) Inventors: Timothy Weidman, Sunnyvale, CA (US); Michael P Nault, San Jose, CA (US); Josephine J Chang, Carmichael, CA (US)

(73) Assignee: Applied Materials, Inc., Santa Clara, CA (US)

( * ) Notice: Subject to any disclaimer, the term of this patent is extended or adjusted under 35 U.S.C. 154(b) by 258 days.

(21) Appl. No.: 09/692,527

(22) Filed: Oct. 18, 2000

Related U.S. Application Data

(60) Provisional application No. 60/160,050, filed on Oct. 18, 1999.

(51) Int. Cl.$^7$ .......................................... H01L 21/4763
(52) U.S. Cl. ..................... 438/623; 438/624; 438/780; 438/786; 438/790; 438/970; 257/759; 257/760
(58) Field of Search ................................ 438/623, 624, 438/763, 780, 786, 789, 790, 970; 257/759, 760

(56) References Cited

U.S. PATENT DOCUMENTS

| | | | |
|---|---|---|---|
| 4,532,150 A | 7/1985 | Endo et al. |
| 5,548,159 A | 8/1996 | Jeng |
| 5,645,891 A | 7/1997 | Liu et al. |
| 5,665,845 A | 9/1997 | Allman |
| 5,736,425 A | 4/1998 | Smith et al. |
| 5,747,880 A | 5/1998 | Havemann et al. |

(Continued)

FOREIGN PATENT DOCUMENTS

| | | |
|---|---|---|
| DE | 1WIN 81106 R | 7/1998 |
| EP | 405501 A2 | 1/1991 |

(Continued)

OTHER PUBLICATIONS

Xu, et al., "BLOk—A low–k Dielectric Barrier/Etch Stop Film for Copper Damascene Applications", Interconnect Technology, 1999, IEEE International Conferecne, pp. 109–111, May 1999.*

(Continued)

Primary Examiner—Amir Zarabian
Assistant Examiner—Christy Novacek
(74) Attorney, Agent, or Firm—Townsend and Townsend and Crew

(57) ABSTRACT

Specific embodiments of the invention provide a silicon-carbide-type or silicon oxycarbide (also often called carbon-doped-oxide [CDO] or organosilicate glass) capping material and method for depositing this capping material on ELK films which are used as a dielectric material in integrated circuits. The ELK film may include any ELK film including but not limited to inorganic, organic and hybrid dielectric materials and their respective porous versions. The silicon-carbide-type material may be an amorphous silicon carbide type material such as the commercially available BLOk™ material, or a carbon-doped oxide material such as the commercially available Black Diamond™ both of which are developed by Applied Materials of Santa Clara, Calif. The amorphous silicon carbide (a-SiC) material is deposited using a plasma process in a non-oxidizing environment and the CDO-type material is deposited using an oxygen-starved plasma process. The non-oxidative or oxygen-starved plasma processes do not significantly degrade the underlying film's chemical and electrical properties. The CDO material offers the advantageous property of having a lower dielectric constant value of less than 3.5 as opposed to the a-SiC material which has a dielectric constant of approximately 4.5. The CDO material besides, having a lower dielectric constant also has a superior adhesion characteristics to the underlying ELK material. However, experiments have indicated that despite its higher dielectric constant, the a-SiC-type material (e.g. BLOk™) may be used to generate capped ELK films with similar or even reduced dielectric constants relative to lower k capped films, and may provide composite (i.e. ELK+cap) structures exhibiting superior k stability.

54 Claims, 2 Drawing Sheets

U.S. PATENT DOCUMENTS

| | | |
|---|---|---|
| 5,807,607 A | 9/1998 | Smith et al. |
| 5,814,370 A | 9/1998 | Martino et al. |
| 5,834,845 A | 11/1998 | Stolmeijer |
| 5,847,443 A | 12/1998 | Cho et al. |
| 5,858,457 A | 1/1999 | Brinker et al. |
| 5,858,871 A | 1/1999 | Jeng |
| 5,914,508 A | 6/1999 | Varmazis et al. |
| 5,922,299 A | 7/1999 | Bruinsma et al. |
| 5,926,740 A * | 7/1999 | Forbes et al. ............ 438/763 |
| 5,948,482 A | 9/1999 | Brinker et al. |
| 5,995,140 A | 11/1999 | Cooper et al. |
| 6,011,123 A | 1/2000 | Kurosawa et al. |
| 6,015,457 A | 1/2000 | Leung et al. |
| 6,037,275 A | 3/2000 | Wu et al. |
| 6,107,357 A | 8/2000 | Hawker et al. |
| 6,120,891 A | 9/2000 | Balkus, Jr. et al. |
| 6,140,221 A * | 10/2000 | Annapragada et al. ...... 438/622 |
| 6,140,252 A | 10/2000 | Cho et al. |
| 6,159,295 A | 12/2000 | Maskara et al. |
| 6,162,583 A | 12/2000 | Yang et al. |
| 6,162,838 A | 12/2000 | Kohl |
| 6,163,066 A | 12/2000 | Forbes et al. |
| 6,168,737 B1 | 1/2001 | Poco et al. |
| 6,171,645 B1 | 1/2001 | Smith et al. |
| 6,171,687 B1 | 1/2001 | Leung et al. |
| 6,172,128 B1 | 1/2001 | Lau et al. |
| 6,184,260 B1 | 2/2001 | Zhong |
| 6,187,248 B1 | 2/2001 | O'Neill et al. |
| 6,197,913 B1 | 3/2001 | Zhong |
| 6,204,202 B1 | 3/2001 | Leung et al. |
| 6,208,014 B1 | 3/2001 | Wu et al. |
| 6,270,846 B1 | 8/2001 | Brinker et al. |
| 6,277,765 B1 | 8/2001 | Cheng et al. |
| 6,297,459 B1 | 10/2001 | Wojnarowski et al. |

FOREIGN PATENT DOCUMENTS

| | | | |
|---|---|---|---|
| EP | | 0 689 235 B1 | 12/1995 |
| EP | | 725440 A2 | 1/1996 |
| EP | | 771026 A2 | 5/1997 |
| EP | | 851490 A2 | 1/1998 |
| EP | | 0 869 515 A1 | 7/1998 |
| EP | | 917184 A2 | 5/1999 |
| WO | WO 98/24724 | | 6/1998 |
| WO | WO 99/03926 | | 1/1999 |
| WO | WO 99/23101 | | 5/1999 |
| WO | WO 99/37705 | | 7/1999 |
| WO | WO 99/41423 | | 8/1999 |
| WO | WO 00/08679 | | 2/2000 |
| WO | WO 00/13221 | | 3/2000 |

OTHER PUBLICATIONS

Loboda et al., "Plasma–enhanced chemical vapor deposition of a SiC:H films from organosilicon precursors", J. Vac. Sci. Technol. A, 12(1), pp. 90–96, Jan./Feb. 1994.*

Loboda et al., "Deposition of Low–k Dielectric Films Using Trimethylsilane", Proceedings of the Electrochemical Society Symposia on Electrochemical Processing in ULSI Fabrication I and Interconnect and Contact Metallization, vol. 98–6, pp. 145–152, 1998.*

Rust, W., "Using Spin–on Dielectrics to Solve Interconnect Challenges," Channel TechWatch, vol. 10, No. 9 (1997).

Peters L., "Solving the Integration Challenges pf Low–k Dielectrics," Semiconductor Int'l, 58–64 (1999).

Singer, P., "Dual–Damascene Challenges Dielectric Etch," Semiconductor Int'l., 68–72 (1999).

Hendricks, N., "Low K Materials for IC International Dielectric Applications: An Updated Status on the Leading Candidates," Low K Dielectric Mat. Tech., SEMICON West, B1–B12 (1999).

M. Matsuura, et al.; A Highly Reliable Self–planarizing Low–k International Dielectric for Sub–quarter Micron Interconnects, Electron Devices Meeting, 1997, Technical Digest, International; Dec. 1997; IEEE (pp. 97–785 to 97–788).

* cited by examiner

US 6,875,687 B1

CAPPING LAYER FOR EXTREME LOW DIELECTRIC CONSTANT FILMS

CROSS-REFERENCES TO RELATED APPLICATIONS

This application claims the benefit of U.S. Provisional Application Ser. No. 60/160,050, filed Oct. 18, 1999, which is incorporated herein by reference.

BACKGROUND OF THE INVENTION

The present invention relates to the formation of dielectric layers. More particularly, embodiments of the present invention relate to a method for capping a low dielectric constant film that is particularly useful as a premetal or intermetal dielectric layer in an integrated circuit.

Semiconductor device geometries have dramatically decreased in size since integrated circuits were first introduced several decades ago, and all indications are that this trend will continue. Today's wafer fabrication plants are routinely producing devices having 0.25 $\mu$m and even 0.18 $\mu$m feature sizes, and the plants of the future will soon be producing devices having even smaller geometries.

The drive to faster and faster microprocessors, and more powerful microelectronic devices, is dependent on improvements in two chemistry-based areas, optical lithography and low dielectric constant materials. Several semiconductor manufacturers, materials suppliers and research organizations have focused on identifying low and extremely low dielectric constant films. As used herein, low dielectric constant materials are those films having a dielectric constant between 3.0 to 2.5 and extremely low dielectric constant ("ELK") films are those films having a dielectric constant below 2.5 extending to dielectric constants below 2.0.

Several candidate low dielectric constant materials are currently under development. Certain specific organic, inorganic and hybrid dielectrics are amongst the current candidates. Additionally, dielectric films from these categories, when made porous, tend to have even lower dielectric constants, and are poised for integration in the next generation of interconnect structures. In terms of deposition techniques, both spin-on and chemical vapor deposition ("CVD") processes are under development, with key challenges remaining around issues of technological performance—i.e. integration.

Among the organic material candidates, organic polymers such as polyarylene and polyarylethers have been most intensively pursued. Two examples of such materials include porous versions of Dow Chemical's SILK [a spin-on low k material (k between 2.6–2.8)] and FLARE from Allied Signal. Spin-on hydrogen silsesquioxane ("HSQ") which has a dielectric constant of 2.9 (k=2.9), is an example of an inorganic dielectric material. Hybrid materials combine organic and inorganic materials. In hybrid materials, cross-linked silicon-oxygen containing polymers designated as polysiloxanes form the basis for conventional spin-on-glass ("SOG") materials. One approach to achieving a lower dielectric constant in hybrid films has been to increase the amount of organic substitution in these materials. For example, where each silicon atom in a spin-on HSQ film is substituted with a methyl group, a methyl-silsesquioxane ("MSQ") results.

As stated above, incorporation of porosity in a dielectric film, regardless of its chemical composition, (i.e. organic, inorganic and hybrid) will reduce the film's dielectric value relative to the solid film. This is due to the fact that the dielectric constant of air is nominally 1. As a result dielectric constants are achievable that are lower than 2.5 including values less than 2.0.

One method of forming a particular type of ELK material which forms a porous oxide film is based on a sol-gel process, in which high porosity films are produced by hydrolysis and polycondensation of a silicon alkoxide such as tetraethylorthosilicate. The sol-gel process is a versatile solution process for making ceramic material. In general, the sol-gel process involves the transition of a system from a homogeneous liquid "sol" (mostly colloidal) into a solid "gel" phase. The starting materials used in the preparation of the "sol" are usually inorganic salts or compounds such as silicon alkoxides. The precursor solutions are typically deposited on a substrate by spin on methods. In a typical sol-gel process, the precursor is subjected to a series of hydrolysis and polymerization reactions to form a colloidal suspension, or a "sol." Further processing of the "sol" enables one to make ceramic materials in different forms. The further processing includes the thermal decomposition of a thermally labile component, which involves the formation of an ordered surfactant-templated mesostructured films by evaporation-induced self-assembly, followed by the thermal decomposition of the template.

In addition to requiring new materials for insulation layers, the trend of decreasing feature size in integrated circuits has created a need for a conductive material having greater conductivity than aluminum which has been the choice in the industry for some time. Many semiconductor manufacturers have turned to copper (Cu) as an interconnect material in place of aluminum, because copper has a lower resistivity and higher current carrying capacity. However, copper has its own difficulties for IC manufacturing processes. For instance, copper diffuses more readily into surrounding materials and hence requires better materials for a barrier layer than traditionally has been used for aluminum. This greater diffuision characteristic exacerbates the low k porosity described above and places even greater emphasis upon the quality of the barrier layers.

An example of an integrated circuit structure which implements copper as an interconnect material is a dual damascene structure. In a dual damascene structure, the dielectric layer is etched to define both the contacts/vias and the interconnect lines. Metal is inlaid into the defined pattern and any excess metal is removed from the top of the structure in a planarization process, such as chemical mechanical polishing (CMP). FIG. 1 shows one example of a dual damascene structure. This structure is appropriate for a first intermetal layer. The integrated circuit 10 includes an underlying substrate 12, which may include a series of layers deposited thereon. The substrate 12 may have transistors therein. A barrier layer 13 may be deposited over the substrate, followed by a dielectric layer 14. The dielectric layer may be undoped silicon dioxide also known as undoped silicon glass (USG), fluorine-doped silicon glass (FSG), or a low k material such as a porous oxide layer or a silicon-carbon or carbon-doped silicon oxide film, or an ELK material. An etch stop layer 16 is deposited over layer 14, pattern etched, and followed by another dielectric layer 18. The structure is then again pattern etched to produce a damascene type pattern. A barrier layer 22 may be needed, which typically has been made from Ta, TaN, Ti, TiN, silicon nitride and plasma enhanced chemical vapor deposited (PECVD) silicon dioxide. However, as explained above, with the smaller feature sizes and increased diffusion propensity of copper, the prior barrier layers are inadequate for optimal performance. Once the conductive material 20 has filled the features, another layer 24, such as a passivation layer, may be deposited. The process described above for a dual damascene structure is exemplary and others may be more appropriate for other particular applications.

Such integration methods when using ELK material and especially porous dielectric materials place additional demands upon the liner or barrier layers. Liner or barrier layers including capping layers such as silicon nitride or silicon dioxide have been deposited adjacent to the low k dielectric layers to prevent the diffusion of byproducts such as moisture and copper. Silicon nitride has been one material of choice for passivation layers. However, silicon nitride has a relatively high dielectric constant (dielectric constant greater than 7.0) and may significantly increase the capacitive coupling between interconnect lines. High dielectric constants result in a capped insulator layer that does not significantly reduce the overall dielectric constant for the combined insulator-capping layer, which defeats the goals of reducing the dielectric constant of the insulating material. Similarly, problems remain in depositing a silicon dioxide capping layer on a porous film. The capping layer is typically deposited in an oxidative PECVD process. Such an oxidative process damages the surface functionality of the underlying porous film and results in degrading the underlying film's chemical properties, which can degrade the low dielectric constant properties of the film. In addition, although silicon-carbide-type material are known to be appropriate for use as barrier or etch stop layers, their use in IC structures using ELK materials and especially porous ELK materials does not appear to be suitable. This is because the lower k silicon carbide-type materials (such as the commercially available Black Diamond™ [k less than 3.0] developed by Applied Materials of Santa Clara, Calif.) are also typically deposited in an oxidative PECVD process, which as described above could damage the underlying porous film, and the higher k silicon-carbide-type films (such as the commercially available BLOk material™ [k less than 4.5] also developed by Applied Materials of Santa Clara, Calif.) may not be suitable because their k value is too high, which could result in an overall capped ELK film stack having too high of a k value.

Therefore, there is a need for a capping layer that will have the lowest dielectric constant possible and one whose deposition process does not damage the underlying ELK film or degrade the underlying film's chemical properties.

SUMMARY OF THE INVENTION

Embodiments of the present invention provide a silicon-carbide-type or silicon oxycarbide (also often called carbon-doped-oxide [CDO] or organosilicate glass) capping material and method for depositing this capping material on ELK films which are used as a dielectric material in integrated circuits. The ELK film may include any ELK film including but not limited to inorganic, organic and hybrid dielectric materials and their respective porous versions. The capping material may be an amorphous, hydrogenated silicon carbide type material such as the commercially available BLOk™ material, or a carbon-doped oxide material such as the commercially available Black Diamond™ both of which are developed by Applied Materials of Santa Clara, Calif. The amorphous silicon carbide (a-SiC) material is, deposited using a plasma process in a non-oxidizing environment and the CDO-type material is deposited using an oxygen-starved plasma process. The CDO material offers the advantageous property of having a lower dielectric constant value of less than 3.5 as opposed to the a-SiC material which has a dielectric constant of approximately 4.5. The CDO material besides, having a lower dielectric constant also has superior adhesion characteristics with respect to the underlying ELK material. Additionally, the non-oxidative or oxygen-starved plasma processes do not significantly degrade the underlying film's chemical and electrical properties. However, experiments have indicated that despite its higher dielectric constant, the a-SiC-type material (e.g. BLOk™) may be used to generate capped ELK films with similar or even reduced dielectric constants relative to lower k capped films, and may provide composite (i.e. ELK+cap) structures exhibiting superior k stability.

In specific embodiments, the ELK film is capped by a hybrid cap including an amorphous silicon carbide layer deposited on the ELK layer and a carbon-doped oxide layer deposited on the amorphous silicon carbide layer. The amorphous silicon carbide layer may be an amorphous, hydrogenated silicon carbide layer having less than about 5 atomic % oxygen, and more preferably no oxygen, which is deposited from a silicon-containing and carbon-containing precursor in a non-oxidizing environment. The carbon-doped oxide layer may be a carbon-doped silicon oxide layer having about 30–50 atomic % oxygen and about 10–30 atomic % carbon.

These and other embodiments of the present invention, as well its advantages and features, are described in more detail in conjunction with the description below and attached figures.

DESCRIPTION OF THE SPECIFIC EMBODIMENTS

Embodiments of this invention provide a method to deposit a silicon carbide type low dielectric constant film as a capping layer or a carbon doped silicon oxide film as a capping layer or a combination thereof over an extremely low dielectric constant ("ELK") film that may contain oxidizable Si—$CH_3$ and/or Si—H groups. The capping layer is deposited using a PECVD process in either a non-oxidizing or an oxygen starved plasma. Both the non-oxidizing and the oxygen starved plasma processes prevent or minimize oxidation of the underlying ELK film.

The lack of an oxidizing plasma in the PECVD deposition process allows the capping layer to be deposited without degrading the ELK film. Using process conditions described below capping layers having a dielectric constant below 5 and preferably below 3 is deposited on an ELK film. Using these process conditions, the deposition regime of the capping layer does not oxidize the Si—$CH_3$ or Si—H bonds in the ELK film, and thus allows for a dielectric constant for the combined ELK film and capping layer stack to be less than 3.0. As used herein a capping layer may be a metal diffusion barrier, an etch stop layer, a CMP stop layer, a photoresist barrier or a final passivation layer.

Figure 1:
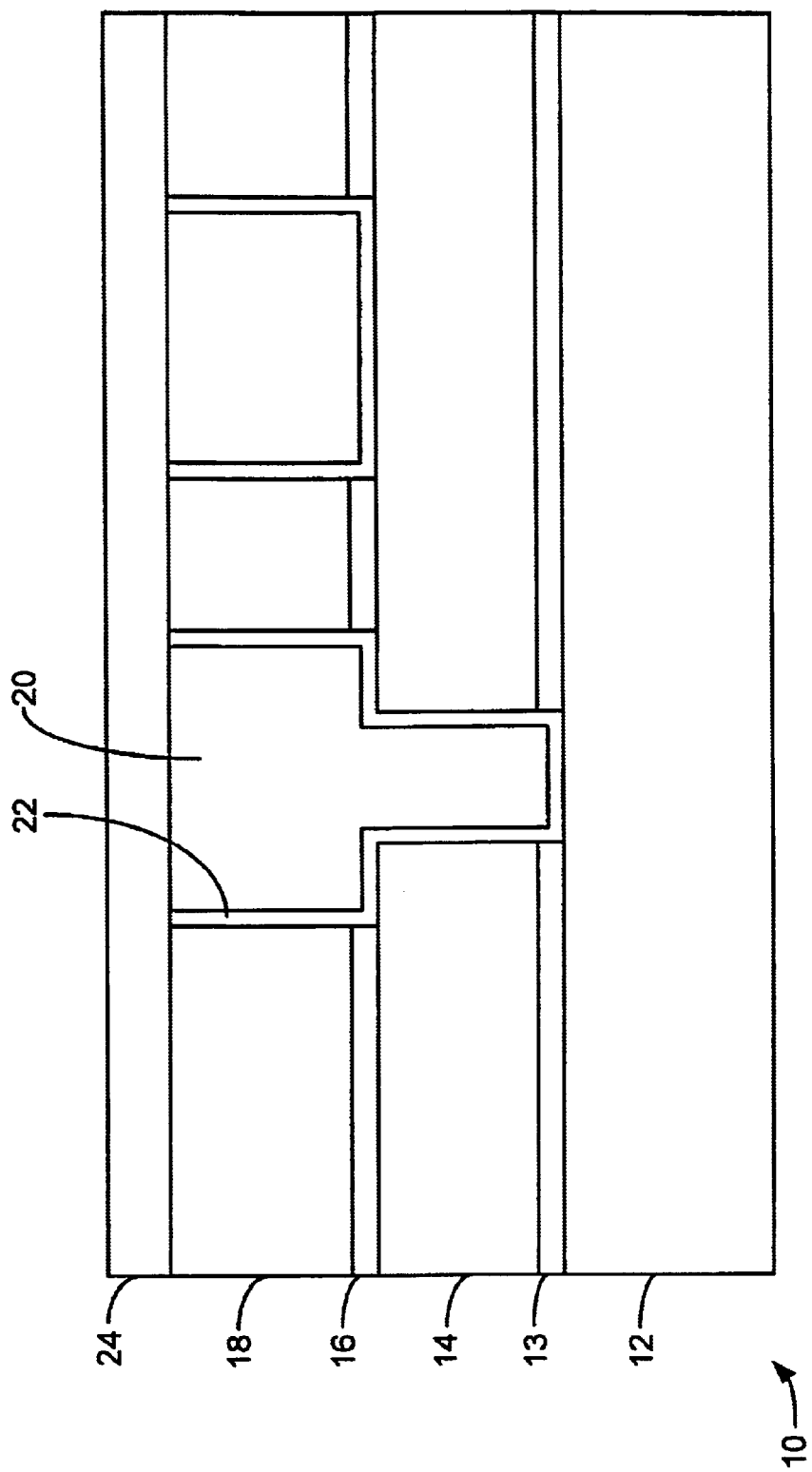
FIG. 1 is a simplified cross-sectional view of a portion of an integrated circuit having a dual damascene structure.
Figure 2:
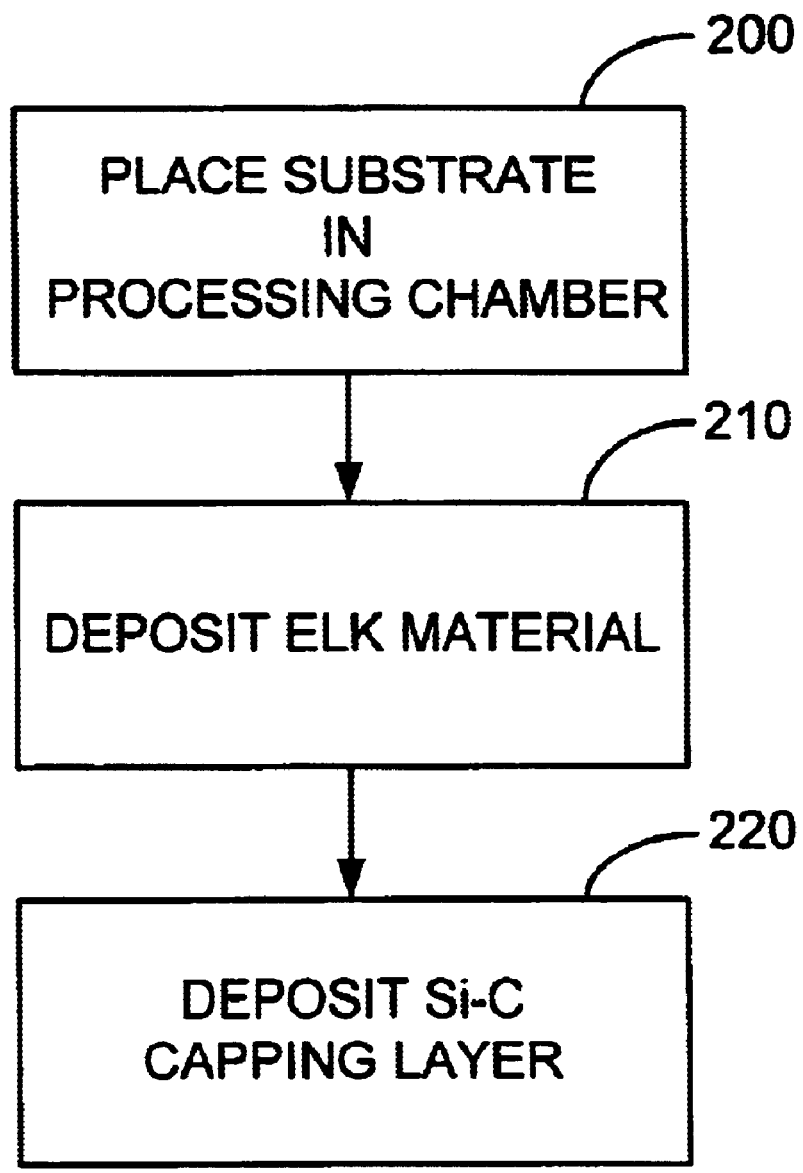
FIG. 2 is a flowchart of a process in which a capped ELK layer is formed.

FIG. 2 is a high-level flowchart of a process for forming a capped ELK layer on a substrate according to an embodiment of the present invention. As shown in FIG. 2, first a substrate is placed in a processing chamber (step 200). Next, an ELK material is formed on the substrate (step 210) and finally the ELK layer is capped by a silicon carbide layer, or alternately by a CDO-type layer, or by a combination of a silicon carbide and a CDO layer (step 220). The chamber used to deposit and the one used to cap the film are not the same chamber since the ELK film is a spin-on film and the cap layer is a CVD film. ELK films are porous and are faced with more challenging downstream wafer processing integration issues. As described above, integration issues encompass many wafer processing steps including those described above for a dual damascene process and which may include photoresist deposition, metallization, etch, and CMP. This means that subsequent processes must not damage the underlying ELK film and subsequently deposited films must be isolated from the underlying ELK. Therefore, a capping layer and its method of deposition on an ELK film must not degrade the underlying film's desired properties. Furthermore, the capping layer should preferably possess a low dielectric constant value to ensure that the gains made in depositing an ELK film are not adversely offset by capping it with a high dielectric constant film and effectively increasing the overall dielectric constant for the capped film stack.

Before describing the capping layer and a method of depositing the capping material according to embodiments of the present invention, an exemplary ELK material and process for its deposition also in accordance with embodiments of the present invention is described below.

Exemplary ELK Material and Methods For Its Deposition

An exemplary process for forming an ELK layer is based on a sol-gel process. In such a particular sol-gel process for forming a porous low dielectric constant film, surfactants act as the template for the film's porosity. The porous film is generally formed by the deposition on a substrate of a sol-gel precursor followed by selective evaporation of solvent components of the sol-gel precursor to form supramolecular assemblies. The assemblies are then formed into ordered porous films by the pyrolysis of the supramolecular surfactant templates at approximately 400° C.

A basic sot-gel process has been previously proposed to deposit ELK films. The first step is the synthesis of the stock precursor solution. The stock precursor solution is prepared, for example, by combining a soluble silicon oxide source, e.g., TEOS (tetraethoxysilane), water, a solvent, e.g. alcohol, and an acid catalyst, e.g. hydrochloric acid, in particular mole ratios at certain prescribed environmental conditions and mixed for certain time periods.

Once the stock solution is obtained, the coating solution is mixed. The general procedure to prepare the coating solution is to add a surfactant to the stock solution. The surfactants are used as templates for the porous silica. In later processes the surfactants are baked out, leaving behind a porous silicon oxide film. Typical surfactants exhibit an amphiphilic nature, meaning that they can be both hydrophilic and hydrophobic at the same time. Amphiphilic surfactants possess a hydrophilic head group or groups which have a strong affinity for water and a long hydrophobic tail which repels water. The long hydrophobic tail acts as the template member which later provides the pores for the porous film. Amphiphiles can aggregate into supramolecular arrays which have the desired structure to be formed as the template for the porous film. Templating oxides around these arrays leads to materials that exhibit controllable pore sizes and shapes. The surfactants can be anionic, cationic, or nonionic, though for the formation of dielectric layers for IC applications, non-ionic surfactants are generally preferred. The acid catalyst is added to accelerate the condensation reaction of the silica around the supramolecular aggregates.

After the coating solution is mixed, it is deposited on the substrate using a spinning process where centrifugal draining ensures that the substrate is uniformly coated with the coating solution. The coated substrate is then pre-baked to complete the hydrolysis of the TEOS precursor, continue the gelation process, and drive off any remaining solvent from the film.

The pre-baked substrate is then further baked to form a hard-baked film. The temperature range chosen for the bake step will ensure that excess water is evaporated out of the spincast film. At this stage the film is comprised of a hard-baked matrix of silica and surfactant with the surfactant possessing an interconnected structure characteristic of the type and amount of surfactant employed. The interconnected structure aids the implementation of the subsequent surfactant extraction phase. The interconnected structure provides continuous pathways for the subsequently ablated surfactant molecules to escape from the, porous oxide matrix.

Typical silica-based films often have hydrophilic pore walls and aggressively absorb moisture from the surrounding environment. If water, which has a dielectric constant (k) of about 78, is absorbed into the porous film, then the low k dielectric properties of the film can be detrimentally affected. Often these hydrophilic films are annealed at elevated temperatures to remove moisture and to ablate and extract the surfactant out of the silica-surfactant matrix. Such an anneal step leaves behind a porousfilm exhibiting interconnected pores. But this is only a temporary solution in a deposition process since the films may still be sensitive to moisture absorption following this procedure.

Some sol-gel processes include further post-deposition treatment steps that are aimed at modifying the surface characteristic of the pores to impart various desired properties, such as hydrophobicity, and increased resistance to certain chemicals. A typical treatment that renders the film more stable is treatment with HMDS (hexamethyldisilizane, [$(CH_3)_3$—Si—NH—Si—$(CH_3)_3$]), in a dehydroxylating process which will remove the hydroxyl groups, replace them with trimethylsilyl groups, and render the film hydrophobic. Alternatively, or in conjunction with such a silylation step, the porous material may be rendered more hydrophobic by the addition of an alkyl substituted silicon precursor, such as $CH_3Si(OCH_2CH_3)$ methyl triethoxysilane or MTES to the precursor formulation.

A variety of alternatives to the above-described sol-gel process for depositing low k materials have been proposed. Many of these alternatives follow the same basic general approach discussed above but vary the choice of ingredients used in the coating solution, the processing times and/or temperatures; combine certain steps; and/or divide other steps into various substeps.

For example, an alternate process for depositing and forming a hardened and stable ELK film according to an embodiment of the present invention is provided below. Using this alternate process, an ELK film was deposited based on a sol-gel-based process as described above. A precursor solution containing at least a silica precursor composed primarily of a silicon/oxygen compound, water, a solvent, a surfactant and a catalyst was formed. The precursor solution was spun on the wafer and the wafer thermally treated by being baked in a chamber at various temperatures between about 90° C. and 450° C. for between about 30 and 3600 seconds in inert or oxidizing environments having pressures in the range from about 0.1 Torr to atmospheric. The silicon/oxygen compound was selected from the group consisting of tetraethylorthosilicate, tetramethoxysilane, phenlytriethyloxy, methyltriethoxysilane and combinations thereof. The solvent was selected from the group consisting of ethanol, isopropanol, propylene glycol monopropyl ether, n-propanol, n-butanol, t-butanol, ethylene glycol and combinations thereof. The surfactant was a non-ionic surfactant selected for example from the group consisting of polyoxyethylene oxides-propylene oxides-polyethylene oxides triblock copolymers, octaethylene glycol monodecyl ether, octaethylene glycol monohexadecyl ether, Triton™ 100, Triton™ 114 and related compounds and combinations thereof More particularly, the precursor solution used in specific embodiments of this invention has the following composition: tetraethoxysilane (TEOS)—22.5 gms; methyltriethoxysilane (MTES)—22.5 gms; propylene glycol monopropyl ether (PGPE)—100 gms; 0.1N Nitric acid—24 gms; tetraethylammonium hydroxide (TMAH)(2.4% in water)—1.0 gms; and Triton X-114—9.67 gms (Triton 114 is trademark of a mixture of ethoxylated p-tert-octylphenols manufactured by the Union Carbide Corporation).

As can be recognized, numerous alternate embodiments of the ELK film may be deposited depending upon the choice of the spin-on solution ingredients and processing times and parameters. The ELK film deposited according to the embodiments of this process exhibits the following properties:

the film is composed essentially of Si—O and Si—CH$_3$ bonds dielectric constant in the range between 1.6 and 2.3 a porosity between 20% and 60% a modulus of elasticity of between 1.4 and 10 GPa, and generally between 3 and 6 GPa a hardness value between 0.4 and 2.0 GPa, and generally between 0.5 and 1.2 GPa a refractive index at 633 nm of between 1.1 and 1.5

One apparatus that can be used for the atmospheric deposition of ELK films according to the embodiments of the invention described above is described in commonly assigned and copending U.S. patent application Ser. No. 09/502,126, entitled A PROCESS AND AN INTEGRATED TOOL FOR LOW K DIELECTRIC DEPOSITION INCLUDING A PECVD CAPPING MODULE, which is incorporated herein by reference in its entirety.

Having described examples of particular ELK films, materials and methods of capping such films are described below. While it has become apparent that forming ELK films having k<2.5 is feasible, such films which are porous are faced with more challenging downstream wafer processing integration issues, which require unique methods and materials to isolate these ELK films from other layers. As described above, a capping layer and its method of deposition on an ELK film must not degrade the underlying film's desired properties. Furthermore, the capping layer should preferably possess a low dielectric constant value to ensure that the gains made in depositing an ELK film are not adversely offset by capping it with a high dielectric constant film and effectively increasing the overall dielectric constant for the capped film stack.

SiC and CDO Materials as Capping Layers for ELLK Films

Embodiments of the present invention provide a silicon-carbide-type or alternately a silicon oxycarbide (also often called carbon-doped-oxide [CDO] or organosilicate glass) capping material, formed according to certain process regimes useful as a capping layer for an integrated circuit, and particularly for an integrated circuit using copper as a conductive material and ELK films as dielectrics. The capping material may be an amorphous, hydrogenated silicon carbide type material such as the commercially available BLOk™ material, or a carbon-doped oxide material such as the commercially available Black Diamond™ both of which are developed by Applied Materials of Santa Clara, Calif. The amorphous silicon carbide (a-SiC) material is deposited using a plasma process in a non-oxidizing environment and the CDO-type material is deposited using an oxygen-starved plasma process. As used herein, an oxygen-starved plasma process is one in which there is sufficient oxygen to react with the precursor to form the CDO-type material, but substantially no excess oxygen is available to react with the substrate. The precursor may be a combination of a silicon-containing precursor and a carbon-containing precursor, an organosilane precursor, or the like.

The CDO material offers the advantageous property of having a lower dielectric constant value of less than 3 as opposed to the a-SiC material which has a dielectric constant of approximately 4.5. The CDO material, besides having a lower dielectric constant, also has superior adhesion characteristics with respect to the underlying ELK material. Additionally, the non-oxidative or oxygen-starved plasma processes do not significantly degrade the underlying film's chemical and electrical properties because at these oxygen levels the plasma processes do not result in the complete oxidation of the organosilane or the organic component of the underlying ELK film. However, experiments have indicated that despite its higher dielectric constant, the a-SiC-type material (e.g. BLOk™) may be used to generate capped ELK films with similar or even reduced dielectric constants relative to lower k capped films, and may provide composite (i.e. ELK+cap) structures exhibiting superior k stability. The process conditions and experimental results are described below.

As described above, and used herein, a capping layer can be a barrier layer, an etch stop, a CMP stop, or other barrier layers isolating an underlying ELK film from other materials subsequently deposited or etched. Embodiments of the present invention also provide processing regimes that include using a silane-based compound for a silicon source in some embodiments and an organosilane as a silicon and carbon source and potentially in the absence of a substantial amount of oxygen. The process regimes also include the presence of inert gases, such as helium or nitrogen, and at certain temperatures, pressures, power outputs in a PECVD chamber to produce the capping material according to embodiments of the present invention. This particular capping material is especially useful as a capping layer for an ELK film, and may be especially useful in complex structures, such as a damascene structure.

Table 1 below shows some general requirements for a capping layer using copper as a conductive material, although other conductors may be applicable.

TABLE 1

Desirable Characteristics of
Dielectric Capping Material
DESIRABLE CHARACTERISTICS OF
DIELECTRIC CAPPING LAYER

| | |
|---|---|
| Good Adhesion | Adhesion to Underlying (ELK Film) and Overlying Layers |
| Not Degrade Underlying Film | Non-oxidizing Deposition Process |
| Good Barrier Property to Copper | No Copper diffusion at 400°–450° C. |
| Lower Dielectric Constant | Overall Low Dielectric Constant (K) in IMD Damascene Stack |
| Adjustable (High or Low) Etch Selectivity with respect to ELK Film | Tuned Composition to match or contrast ELK Film to Effect Selectivity |
| Good Electrical Properties | High breakdown Voltage Low Leakage |

Referring to Table 1, adequate adhesion between layers is required to avoid or reduce delamination between them. A measure of adhesion strength is the stud pull test. Using this criterion, an adhesion strength greater than 35 MPa is desired, and tests showed that an adhesion strength of at least 35 MPa was obtained for the capping layer when deposited in accordance with the process described below. The capping material must be such that its deposition process does not degrade the underlying ELK film. This criterion is satisfied by depositing the capping material from a non-oxidizing or oxygen-poor plasma. In case of the oxygen-poor plasma, all or most of the oxygen in the process gas should be consumed in the reaction with the organosilane such that no oxygen is left free to react with the chemical structure of the underlying ELK film. The capping material should also have substantially no diffusion at the substrate annealing temperature of, for example, 400°–450° C. The term "no substantial" diffusion is intended to be a functional term, such that any actual diffusion into the layer is less than would affect the ability of the capping layer to function as such. For instance, the silicon carbide of an embodiment of the present invention limits the diffusion to about 250Å. The copper diffusion may impair the desired current and voltage paths and contribute to cross-talk. Because of the decreasing feature size, as described above, the lower dielectric constant, preferably less than 5, the lower is the probability for cross talk and RC delay which degrades the overall performance of the device. Related to the low dielectric value of the film is the overall stack dielectric value, which corresponds to the overall dielectric value of the combined capped ELK film (i.e. ELK film and capping layer), where a desirable value should be 3.0 or less.

Because the barrier layer may be used in a damascene structure, it would be beneficial to also have suitable etch stop characteristics, such as an etch selectivity ratio of 1:3 or preferably lower with respect to ELK materials. On the other hand, it may be advantageous to tune the composition of the capping layer to match that of the ELK film to have a low etch selectivity and hence allow for single pass etch of the capping layer and the ELK film. A low etch selectivity may be used in which a via pattern is transferred through the capping layer and into the ELK film at the same time the photoresist is removed. Additionally the capping material should have a high breakdown voltage of 2 MV/cm or more. It should also have a low leakage through the layer, i.e., a low stray direct current that capacitively flows through the material. Another desired characteristic from a commercial standpoint is that the material should be compatible with other processes, so the processes may be conducted in-situ. i.e. in a given chamber, such as in an integrated cluster tool arrangement, without exposing the material to a contaminating environment, to produce better throughput and process control. This aspect may be particularly important with ELK films, because of their porosity and susceptibility to moisture absorption.

Table 2 below shows the process parameters used in a chamber that allows the film to be used as a capping layer in accordance with specific embodiments of the present invention. In the embodiments tested, the silicon and carbon were derived from a common compound, such as an organosilane-based compound. However, the carbon could be supplemented with other compounds, such as methane. Without limitation, suitable silane-based compounds could include: methylsilane($CH_3SiH_3$), dimethylsilane(($CH_3$)$_2$SiH$_2$), trimethylsilane(($CH_3$)$_3$SiH), diethylsilane(($C_2H_5$)$_2$SiH$_2$), propylsilane($C_3H_8SiH_3$), vinyl methylsila ($CH_2$=CH)$CH_3SiH_2$), 1,1,2,2-tetramethyl disilane(HSi($CH_3$)$_2$—Si($CH_3$)$_2$H), hexamethyl disilane(($CH_3$)$_3$Si—Si($CH_3$)$_3$), 1,1,2,2,3,3-hexamethyl trisilane(H($CH_3$)$_2$Si—Si($CH_3$)$_2$—SiH($CH_3$)$_2$), 1,1,2,3,3-pentamethyl trisilane(H($CH_3$)$_2$Si—SiH($CH_3$)—SiH($CH_3$)$_2$), and other silane related compounds. In addition to organosilanes exemplified by the above list, organosiloxanes such as tetramethyl cyclotetrasiloxane may be used, with or without the addition of another oxygen source, for the deposition of CDO type caps. For the purpose of this invention, the term "organosilane" as used herein includes any silane-based compound having at least one carbon atom attached, including the preceding list, unless otherwise indicated. In Table 2, the compound used was trimethylsilane ("3MS"). A process gas, such helium, nitrogen, or oxygen was present and might assist in stabilizing the process, although other gases could be used.

TABLE 2

Process Parameters for Capping Layer Deposition

| Parameter | Range | CDO | a-SIC | a-SIC + CDO Dep 1: a-SIC; Dep 2; CDO |
|---|---|---|---|---|
| Silicon and Carbon (3MS) | 50–2400 sccm (6 × oxygen flow) | 600 sccm | 160 sccm | 300 sccm  600 sccm |
| Oxygen | 0–400 sccm | 100 sccm | 0 | 0  100 sccm |
| Helium | 0–5000 sccm | 0 | 400 sccm | 0  0 |
| Nitrogen | 0–5000 sccm | 0 | 0 | 0  0 |
| RF Power | 100–900 W | 590 W | 560 W | 300 W  590 W |
| Pressure | 1–15 Torr | 3.8 Torr | 8.7 Torr | 3.8 Torr  3.8 Torr |
| Temperature | 350°–450° C. | 400° C. | 400° C. | 400° C.  400° C. |
| Spacing | 200–600 mil | 280 mil | 280 mil | 280 mil  280 mil |

The inventors have discovered that the process regime described above establishes the suitability of the capping material in meeting the desired criteria of a capping layer for ELK films. As used herein, the capping material includes both the a-SiC and the CDO materials. Using these process regimes, the capping layer can have a low dielectric constant of about 5 or less and can be extended to 3.5 or less by addition of some oxygen. Moreover, the effective dielectric constant of the stack composed of the ELK layer and the cap layer can be less than 2.5 for relatively thin cap layers. This effective dielectric constant meets the needs of a suitable capping layer especially for an ELK and copper-based integrated circuit. The capping material is also suitable as a low k, etch stop material. A low k etch stop material is defined herein as an etch stop material having a dielectric constant equal to or lower than that of silicon nitride (dielectric constant greater than or equal to 7.0) and having a relative oxide to etch selectivity of 2 to 1 or greater. This ratio allows greater control over the etching process and is particularly useful when etching a complex structure, such as a damascene structure. Also by tuning the composition of the capping layer to match that of the ELK film, thus having a low etch selectivity, allows for single pass etch of the capping layer and the ELK film. A low etch selectivity may be used such that a via pattern is transferred through the capping layer and into the ELK film at the same time the photoresist is removed.

To form the capping layer in the preferred process regime, a silicon source such as trimethylsilane may be supplied to a plasma reactor, specifically a reaction zone in a chamber that is typically between the substrate surface and the gas dispersion element, such as a "showerhead," commonly known to those with ordinary skill in the art. Typical commercial PECVD chambers that may be used to practice embodiments of this invention to cap an ELK film, are the DxZ and Producer chambers produced by Applied Materials, Inc. of Santa Clara, Calif. Alternately, the entire stack (i.e. formation of ELK film and PECVD cap) may be formed in an integrated atmospheric deposition and vacuum cap system as described above. The sequence of operation of a commercial PECVD chamber is well known and needs no explanation for the embodiments of the present invention process regimes. The capping layer may be deposited at a temperature from 100–450° C.

CDO Cap Deposition

Using such a PECVD chamber, a precursor source such as a trimethylsilane may be provided at a flow rate of about 600 standard cubic centimeters per minute (sccm). The reaction may occur without a substantial source of oxygen introduced into the reaction zone; more particularly a flow of 100 sccm of oxygen gas is used. In conjunction with the silicon and carbon sources, a process gas, such as helium or nitrogen, may flow into the chamber at a rate of about 0–5000 sccm each respectively. The chamber pressure is maintained between about 1 and 15 Torr, and more particularly 3.8 Torr. An RF power source may apply between about 100 and 900 watts, and preferably about 590 watts to the anode and cathode to form the plasma in the chamber with the silane-based gas. The substrate surface temperature may be maintained between about 300° and 450° C., and more particularly about 400° C. during the deposition of the capping layer. The gas may be dispersed at a showerhead to substrate spacing distance between about 200 and 600 mils, and more particularly at 280 mil. Using this recipe a deposition rate of approximately 3700 Å/min was achieved. The measured thickness for the combined capped ELK film was approximately 5270 Å, and the dielectric constant for the capped ELK film was 2.38. The ELK film's dielectric constant was measured to be 2.16. Alternately, an ELK film was capped with a layer of a-SiC material as described below.

a-SiC Cap Deposition

Using such a PECVD chamber, a silicon carbide source such as a trimethylsilane may be delivered at a flow rate of about 160 standard cubic centimeters per minute (sccm). The reaction occurs without any source of oxygen introduced into the reaction zone. In conjunction with the trimethylsilane (silicon and carbon sources), a process gas, such as helium or nitrogen, may flow into the chamber at a rate of about 0–5000 sccm each respectively; more particularly, a flow of 400 sccm of helium is used. The chamber pressure is maintained between about 1 and 15 Torr, and more particularly 3.8 Torr. An RF power source may apply between about 100 and 900 watts, and preferably about 560 watts to the anode and cathode to form the plasma in the chamber with the silane-based gas. The substrate surface temperature may be maintained between about 350° and 450° C., and more particularly about 400° C. during the deposition of the capping layer. The gas may be dispersed at a showerhead to substrate spacing distance between about 200 and 600 mils, and more particularly at 280 mil. Using this recipe a deposition rate of approximately 3700 Å/min was achieved. The measured thickness for the combined capped ELK film was approximately 5222 Å, and the dielectric constant for the capped ELK film was 2.22. The ELK film's dielectric constant was measured to be 2.16. Alternately, an ELK film may be capped with a combined capping layer by first depositing an a-SiC cap followed by CDO cap as described below.

Combined a-SiC and CDO Cap Deposition

For the first deposition, namely the a-SiC deposition, a silicon carbide source such as a trimethylsilane may be provided at a flow rate of about 300 standard cubic centimeters per minute (sccm). The reaction occurs without any oxygen introduced into the reaction zone. The chamber pressure is maintained between about 1 and 15 Torr, and more particularly 3.8 Torr. An RF power source may apply between about 100 and 900 watts, and preferably about 300 watts to form the plasma in the chamber with the trimethylsilane. The substrate surface temperature may be maintained between about 350° to 450° C., and more particularly about 400° C. during the deposition of the a-SiC capping layer. The gas may be dispersed at a showerhead to substrate spacing distance between about 200 and 600 mils, and more particularly at 280 mil. Next, a CDO cap is deposited on the a-SiC cap. Using the same PECVD chamber, an organosilane such as trimethylsilane at a flow rate of about 600 standard cubic centimeters per minute (sccm) may be used. The carbon may be derived from the trimethylsilane or methylsilane. The reaction may occur without a substantial source of oxygen introduced into the reaction zone; more particularly a flow of 100 sccm of oxygen gas is used. The chamber pressure is maintained between about 1 and 15 Torr, and more particularly 3.8 Torr. An RF power source may apply between about 100 and 900 watts, and preferably about 600 watts to the anode and cathode to form the plasma in the chamber. The substrate surface temperature may be maintained between about 350° and 450° C., and more particularly about 400° C. during the deposition of the capping layer. The gas may be dispersed at a showerhead to substrate spacing distance between about 200 and 600 mils, and more particularly at 280 mil. Using this recipe a deposition rate of approximately 3700 Å/min was achieved. The measured thickness for the combined capped ELK film was approximately 5107 Å, and the dielectric constant for the capped ELK film was 2.15. The ELK film's dielectric constant was measured to be 2.16.

As described above, The capping layer may be a film such as the commercially available BLOk™ material, or a CDO type film compound such as the commercially available Black Diamond™ both of which are developed by Applied Materials of Santa Clara, Calif. The a-SiC compound is deposited using a plasma process in a non-oxidizing environment and the CDO compound is deposited using an oxygen-starved plasma process.

The advantages of such a capping layer for ELK films as compared to traditional capping layers such as silicon oxide and silicon nitride are numerous. The non-oxidative or alternately the oxygen-starved process regime of embodiments of the present invention does not allow any substantial reaction between the plasma and the Si—C, C—H, and Si—H (if any) bonds present in the underlying ELK film and thus no substantial degradation in the ELK film's desirable dielectric and moisture-repelling properties is observed. Depositing silicon oxide as a capping layer in an oxidizing plasma environment would burn out the carbon in the ELK film, and degrade the ELK film's desirable properties. A set of tests carried out by the inventors, where a 1000 Å SiC capping layer was deposited on a 5000 Å ELK film, showed that overall stack dielectric values of 3.0 or less were achieved, which indicated that the deposition recipe, described below, did not adversely impact the ELK film's properties. The ELK layer alone had a k of 2.0.

Additional tests carried out by the inventors using processes described above, involved the capping of the ELK film with three different capping layers. The first capping layer was the CDO cap; the second was the a-SiC cap, and the third was a two layer cap consisting of first capping the ELK film with an a-SiC cap and then with a CDO layer. The process conditions used for these tests are described above. The results of these experiments were quite unexpected in that the overall dielectric constant of the capped ELK film which was capped with a higher dielectric constant cap was actually lower than the overall dielectric constant of the capped ELK film which was capped with a lower dielectric constant cap.

The CDO material offers the advantageous property of having a lower dielectric constant value of less than 3 as opposed to the a-SiC material which has a dielectric constant of approximately 4.5. Additionally, the oxygen-starved plasma processes do not significantly degrade the underlying film's chemical and electrical properties. However, as stated above, experiments have indicated that despite its higher dielectric constant, the a-SiC-type material (e.g. BLOk™) may be used to generate capped ELK films with similar or even reduced dielectric constants relative to lower k capped films, and may provide composite (i.e. ELK+cap) structures exhibiting superior k stability. These experiments support the unexpected result that films capped with the higher k SiC type film give better overall k values and k stability for the stack than films capped with the lower k SiC material. The inventors believe that this is due to the fact that the lower k cap (CDO) deposition may induce some oxidation of the underlying ELK film during the deposition process. Also because of the oxidation of the ELK film and the lower effectiveness of CDO layers as moisture barriers, the k stability for the ELK-CDO stack is worse than the ELK-a-SiC stack, as shown in Table 3 below.

TABLE 3

Summary Results of SiC Capped ELK Films

| Wafer ID | Description | k | k after H2O | % k increase |
|---|---|---|---|---|
| 356 | Elk | 2.16 | 2.28 | 5.9 |
| 247 | Elk, CDO | 2.38 | 2.47 | 3.6 |
| 244 | Elk, a-Si-C | 2.22 | 2.25 | 1.6 |
| 354 | Elk, a-Sic-CDO | 2.15 | 2.21 | 2.8 |

The results summarized in Table 3 above are unexpected in that one would anticipate that a film stack consisting of an ELK film and a capping layer would exhibit a lower overall k when capped with a lower k capping layer. It is known that CDO films have a lower k (approximately 3) as compared to a-SiC films (approximately 4.5). However as the results of experiments show, the ELK film capped with the a-SiC exhibits a lower overall k. As shown above, the ELK film stack capped with an a-SiC material has an overall k of 2.22 as compared to the film stack capped with a CDO material which has a k of 2.38. Moreover, the a-Sic capped ELK film exhibits a better k stability. K stability is a measure of the moisture absorption of the film stack. The test is carried out by soaking the film stack in water and then measuring the k of the stack and comparing the post soak k to the non-soaked k. As can be seen from Table 3, the non-capped film experienced a 5.9% increase in its k value due to moisture intake, and of the capped films, the a-SiC capped film only experienced a 1.6% increase in k as compared to the CDO capped film which showed a 3.6% increase in its k value. The inventors having observed the unexpected advantage of capping the ELK film with an a-SiC material, conducted additional tests to determine whether a hybrid cap could be developed. The hybrid cap is one that takes full advantage of the non-oxidizing effect of the a-SiC deposition and the lower k of the CDO films. The last row in Table 3 above shows the results for such a case. The deposition recipe for this case was also described above. The desire to have a hybrid cap is driven by the demands of future ICs to have the lowest k cap but not at the expense of damaging the k value of the underlying ELK films. The inventors believe that an optimum hybrid cap may use an a-SiC cap deposited in a non-oxidizing environment to seal and cap the ELK film, and a CDO film to achieve a lower cap k value. This hybrid cap provides the additional and improved adhesion properties, since CDO films are known to adhere better to layers that may subsequently be deposited on the capped ELK film stack. As shown on Table 3, the hybrid cap exhibits an even lower k than the other capped films. The inventors believe that the a-SiC cap may actually be improving the k value of the underlying ELK film by an infiltration-type process. These results suggest that ELK films capped with an a-SiC cap in a non-oxidizing environment are not damaged and are adequately capped by being isolated from other layers.

Other capping materials such as the traditional silicon nitride cap has a relatively high dielectric constant. Although the high dielectric value could be addressed by depositing a relatively thin layer, its deposition can involve the use of an ammonia-based ($NH_3$) process gas. Such a process gas also reacts with and is detrimental to the underlying ELK film. Lastly and importantly, the adhesion between silicon-carbide type films as taught by the embodiments of the present invention are superior to other PECVD-based films. For example, the SiC material of the present invention has a high adhesion strength with test data showing an adhesion strength of greater than 5 ksi.

Having fully described several embodiments of the method of the present invention for depositing and capping a particular type of ELK film as described above, many other equivalent or alternative methods of depositing and capping ELK layers according to the present invention will be apparent to those skilled in the art. Additionally, the capping layer and the method of depositing the capping layer as described herein are equally applicable and equally advantageous as capping layers for other low dielectric constant or other ELK films. Low dielectric constant or ELK films other than the hybrid carbon doped porous oxide ("CDPO") described above can be other hybrid, organic and inorganic films including the porous variants thereof. Examples of organic films are Dow Chemical's SiLK (a spin-on low k material (k between 2.6–2.8)) and FLARE from Allied Signal, and porous versions of these films. Examples of other hybrid films are HSQ and MSQ films and their respective porous variants. These equivalents and alternatives are intended to be included within the scope of the present invention which is set forth in the following claims.

What is claimed is:

1. A process for capping an extremely low dielectric constant ("ELK") film for a semiconductor device, the process comprising:

forming an ELK film on a substrate; and
   depositing an amorphous silicon carbide capping layer on said ELK film,
   wherein the amorphous silicon carbide capping layer remains in the semiconductor device.

2. The process of claim 1 further comprising forming a carbon-doped silicon oxide capping layer on the amorphous silicon carbide capping layer, wherein the carbon-doped oxide layer has a dielectric constant less than the dielectric constant of the amorphous silicon carbide capping layer.

3. The process of claim 1 wherein said amorphous silicon carbide capping layer is hydrogenated, and has a dielectric constant of approximately 4.5.

4. The process of claim 1 wherein said amorphous silicon carbide capping layer does not adversely react with said ELK film to substantially degrade said ELK film's dielectric property.

5. The process of claim 1 wherein said amorphous silicon carbide capping layer has an adhesion strength to said ELK film of greater than 35 MPa.

6. The process of claim 1 wherein said amorphous silicon carbide capping layer permits no substantial penetration of moisture.

7. The process of claim 4 wherein said ELK film has a dielectric constant of less than 2.5.

8. The process of claim 1 wherein the ELK film comprises Si—O bonds.

9. The process of claim 1 wherein said amorphous silicon carbide capping layer is copper diffusion resistant.

10. The process of claim 9 wherein said ELK film has a dielectric constant of less than 2.5.

11. The process of claim 1 wherein a combined dielectric constant for a stack comprising said ELK film and said silicon carbide capping layer is less than 3.0.

12. The process of claim 11 wherein the combined dielectric constant is less than 2.5.

13. The process of claim 1 wherein said amorphous silicon carbide capping layer is an amorphous, hydrogenated silicon carbide layer deposited by:
    introducing a silicon containing precursor, a carbon containing precursor, and a carrier gas into a chamber; and
    applying energy to react said silicon containing precursor and said carbon containing precursor to deposit said amorphous, hydrogenated silicon carbide capping layer on said ELK film in a non-oxidizing environment.

14. The process of claim 13 wherein said silicon containing precursor comprises an organosilane compound.

15. The process of claim 13 wherein said silicon containing precursor and carbon containing precursor are derived from a common organosilane precursor.

16. The process of claim 13 wherein said silicon carbide capping layer is deposited at a temperature of between approximately 100° to 450° C.

17. The process of claim 13 wherein applying energy comprises generating a plasma in said chamber.

18. The process of claim 1 further comprising depositing a carbon-doped oxide layer on said amorphous silicon carbide capping layer.

19. The process of claim 18 wherein said carbon-doped oxide layer is a carbon-doped silicon oxide layer formed by:
    introducing a silicon containing precursor, a carbon containing precursor, and a process gas into a chamber, said process gas including oxygen; and
    providing a plasma in said chamber to react said silicon containing precursor and said carbon containing precursor in the presence of said plasma to deposit said carbon-doped silicon oxide layer on said amorphous silicon carbide capping layer.

20. The process of claim 19 wherein said oxygen is introduced at a rate to produce an oxygen-starved plasma for depositing said carbon-doped silicon oxide layer.

21. The process of claim 19 wherein said silicon containing precursor and carbon containing precursor are derived from a common organosilane precursor.

22. The process of claim 21 wherein said organosilane precursor is provided at a rate approximately six times that of the flow of oxygen gas.

23. The process of claim 1 wherein the ELK film comprises a porous material.

24. The process of claim 23 wherein the porous material comprises silicon oxide.

25. The process of claim 23 wherein the capping layer is within a stack of ELK films.

26. The process of claim 23 wherein the capping layer has a breakdown voltage of 2 MV/cm or more.

27. A process for capping an extremely low dielectric constant ("ELK") film using a silicon carbide material in a semiconductor device, the process comprising:
    forming an ELK film on a substrate; and
    depositing a silicon carbide capping layer having a dielectric constant of approximately less than 5 on said ELK film, where said silicon carbide layer is produced by a process providing a silicon containing precursor, a carbon containing precursor and process gases comprising oxygen, helium and nitrogen, and providing said silicon containing precursor and said carbon containing precursor at a rate approximately six times that of the oxygen and further comprising reacting said silicon and said carbon containing precursor in a chamber having a pressure in the range of about 1 to 15 Torr with an RF power source supplying a power at approximately 300–600 watts and a substrate surface temperature between approximately 100° and approximately 450° C. and having a shower head to substrate spacing of approximately 200 to approximately 600 mils, and wherein said capping layer has an adhesion strength of at least about 35 MPa to said ELK film, and wherein the dielectric constant for a stack consisting of said ELK film and said silicon carbide layer is at most approximately 3.0, and
    wherein the silicon carbide capping layer remains in the semiconductor device.

28. A stack having a capped extremely low dielectric constant ("ELK") layer for a semiconductor device, the stack comprising:
    a substrate;
    an ELK layer formed on said substrate;
    an amorphous silicon carbide layer deposited on said ELK layer; and
    a carbon-doped oxide layer deposited on said amorphous silicon carbide layer, wherein the amorphous silicon carbide layer and the carbon-doped oxide layer remain in the semiconductor device.

29. The stack of claim 28 wherein said amorphous silicon carbide layer is deposited from a silicon-containing and carbon-containing precursor in a non-oxidizing environment.

30. The stack of claim 28 wherein said carbon-doped oxide layer is a carbon-doped silicon oxide layer.

31. The stack of claim 28 wherein said carbon-doped oxide layer comprises about 30–50 atomic % oxygen.

32. The stack of claim 28 wherein said amorphous silicon carbide layer has an effective dielectric constant of approximately less than 5.

33. The stack of claim 28 wherein said carbon doped oxide layer has an effective dielectric constant of approximately less than 3.5.

34. The stack of claim 28 wherein said amorphous silicon carbide layer has an adhesion strength to said ELK layer of at least about 35 MPa.

35. The stack of claim 28 wherein said amorphous silicon carbide layer is a moisture resistant layer.

36. The stack of claim 28 wherein said carbon-doped oxide layer is produced in an oxygen-starved plasma.

37. The stack of claim 28 wherein the ELK film comprises Si—O bonds.

38. The stack of claim 28 wherein said amorphous silicon carbide layer is an amorphous, hydrogenated silicon carbide layer having less than about 5 atomic % oxygen.

39. The stack of claim 38 wherein said amorphous silicon carbide layer is a hydrogenated amorphous silicon carbide layer that has substantially no oxygen.

40. The stack of claim 28 wherein said carbon-doped oxide layer comprises about 10–30 atomic % carbon.

41. The process of claim 45 wherein the capping layer comprises the amorphous silicon carbide film.

42. The stack of claim 28 wherein said stack has a combined dielectric constant of approximately less than 3.

43. The stack of claim 42 wherein said stack has a combined dielectric constant of approximately less than 2.5.

44. A stack having a capped extremely low dielectric constant ("ELK") layer, comprising:
    a substrate;
    an ELK layer formed on said substrate;
    an amorphous silicon carbide layer deposited on said ELK layer; and
    a carbon-doped oxide layer deposited on said amorphous silicon carbide layer,
    wherein said carbon-doped oxide layer is produced by a process providing a silicon containing precursor, a carbon containing precursor and process gases comprising oxygen, helium and nitrogen, and providing said silicon containing precursor and said carbon containing precursor at rate approximately six times that of the oxygen and further comprising reacting said silicon and said carbon containing precursor in a chamber having pressure in the range of about 1 to 15 Torr with an RF power source supplying a power at a rate of approximately 300–600 watts and a substrate surface temperature between approximately 100° and approximately 450° C. and having a shower head to substrate spacing of approximately 200 to approximately 600 mils.

45. A process for capping a low dielectric constant film in a semiconductor device, the method comprising:
    forming a porous, low-dielectric constant film on a substrate; and
    depositing a capping layer on the low-dielectric constant film, wherein the capping layer comprises a carbon-doped oxide or an amorphous silicon carbide film, and wherein the capping layer has a dielectric constant of about 5.0 or less,
    wherein the capping layer remains in the semiconductor device.

46. The process of claim 45 wherein the capping layer has a dielectric constant of about 4.5 or less.

47. The process of claim 45 wherein the capping layer is in direct contact with the porous, low-dielectric constant film.

48. The process of claim 45 wherein the porous, low-electric constant film has a dielectric constant less than about 2.5.

49. The process of claim 45 wherein the porous, low dielectric constant film and the capping layer are in a stack of layers, and wherein the stack of layers has an effective dielectric constant less than about 3.0.

50. The process of claim 45 wherein the porous, low dielectric constant film comprises Si—O bonds.

51. The process of claim 45 wherein the porous, low dielectric constant film comprises silicon oxide.

52. The process of claim 45 wherein the capping layer is within a stack of ELK films.

53. The process of claim 45 wherein the capping layer has a breakdown voltage of 2 MV/cm or more.

54. The process of claim 45 wherein the capping layer comprises the carbon-doped oxide.

* * * * *